United States Patent [19]

Suzuki et al.

[11] 4,266,128
[45] May 5, 1981

[54] ELECTRON MICROSCOPE WITH OPTICAL MICROSCOPE

[76] Inventors: Shigeru Suzuki, 2736-34, Sunagawa-cho, Tachikawa-shi, Tokyo, Japan, 190; Kazuo Ohsawa, 295, Nakagami-cho, Akishima-shi, Tokyo, Japan, 196

[21] Appl. No.: 107,627

[22] Filed: Dec. 27, 1979

[30] Foreign Application Priority Data

Dec. 28, 1978 [JP] Japan .................................. 53-161214

[51] Int. Cl.³ .............................................. G01N 23/00
[52] U.S. Cl. .................................... 250/311; 250/442; 250/457
[58] Field of Search ........................ 250/442, 459, 311

[56] References Cited

U.S. PATENT DOCUMENTS

| | | | |
|---|---|---|---|
| 3,514,595 | 5/1970 | Schwarz et al. ...................... | 250/311 |
| 3,823,321 | 7/1974 | Rauch .................................. | 250/442 |
| 3,885,157 | 5/1975 | Heinemann ........................... | 250/442 |

*Primary Examiner*—Harold A. Dixon

*Attorney, Agent, or Firm*—Lane, Aitken, Ziems, Kice & Kananen

[57] ABSTRACT

A combination of electron microscope and optical microscope. The optical microscope is juxtaposed adjacent to the electron microscope so that the optical and lens axes of respective microscopes extend in parallel to each other. A specimen transfer mechanism is provided in common to both of the electron microscope and the optical microscope for interchangeably positioning a specimen to be observed at respective predetermined positions along the lens axis and the optical axis for alternative observations through the electron microscope and the optical microscope. The specimen transfer means including specimen holding bar adapted to be displaced in two-dimensional direction in a plane extending orthogonally to both of the lens axis and the optical axis thereby to interchangeably position the specimen at the predetermined positions through displacement of the specimen holding bar which corresponds to a distance between the lens axis and the optical axis. One and the same specimen is allowed to be interchangeably observed through both of the electron microscope and the optical microscope by correspondingly manipulating the specimen transfer means.

6 Claims, 2 Drawing Figures

ELECTRON MICROSCOPE WITH OPTICAL MICROSCOPE

BACKGROUND OF THE INVENTION

1. Field of the Invention

The present invention generally relates to an electron microscope and in particular to an electron microscope which is combined with an optical microscope so that a same specimen can be exchangeably observed through both microscopes.

2. Description of the Prior Art

An optical microscope permits observation of a specimen in respect of color and structure thereof. However, the resolution power of the optical microscope is far lower than that of an electron microscope. Although the latter is capable of observing a fine structure of the specimen, it is impossible to observe the coloration of the specimen. Such being the circumstances, separate observations through the optical microscope and the electron microscope are required when a specimen is to be examined in respect of coloration and structure, which means very troublesome procedure. Besides, when a fragmental portion of a specimen has to be analyzed, a high skillfulness is required in order to accurately align the specimen at predetermined positions of the optical microscope and the electron microscope so that the same portion of the specimen in concern can be correctly observed through both microscopes. Thus, there is a great demand for electron microscope which is combined with an optical microscope in such a manner that one and the same specimen can be interchangeably or exchangeably placed at predetermined positions in the optical and the electron microscopes through simple manipulation.

SUMMARY OF THE INVENTION

Accordingly, an important object of the invention is to provide an electron microscope combined integrally with an optical microscope in which a specimen to be examined can be interchangeably and selectively placed at a predetermined specimen position either in the electron microscope or in the optical microscope through a simple manipulation.

Another object of the invention is to provide a specimen transfer mechanism for the electron microscope combined with the optical microscope which is capable of correctly positioning a specimen interchangeably either in the electron microscope or optical microscope without involving positional deviations of the specimen such as upsetting, inclination, displacement or the like.

A further object of the invention is to provide an electron microscope combined with an optical microscope and incorporating a single specimen supporting member which is common to both of the microscopes and adapted to be exchangeably indexed to predetermined specimen positions in both the microscopes with the specimen being held in the same orientation, whereby the focal alignment of the specimen image can be attained through identical adjusting operations at both of the microscopes.

In view of above and other objects which will become more apparent as description proceeds, there is proposed according to a general object of the invention an electron microscope combined with an optical microscope, wherein the optical microscope is juxtaposed adjacent to the electron microscope assembly so that the optical axis of the optical microscope extends in parallel to the lens axis of the electron microscope assembly, comprising specimen transfer means provided in common to both of the electron microscope assembly and the optical microscope for interchangeably positioning a specimen to be observed at respective predetermined positions along the lens axis and the optical axis for observations through the electron microscope and the optical microscope, respectively, the specimen transfer means including specimen carrier means adapted to be displaced in two-dimensional direction in a plane extending orthogonally to both of the lens axis and the optical axis thereby to interchangeably position the specimen at the predetermined positions through displacement of the specimen carrier means corresponding to a distance between the lens axis and the optical axis, whereby the same specimen is allowed to be interchangeably observed through both of the electron microscope and the optical microscope by correspondingly manipulating the specimen transfer means.

In a preferred embodiment of the invention, the specimen transfer means includes a specimen table which is adapted to be movable in the plane in two orthogonal directions and drive means for moving the specimen table for positioning the specimen accurately at a selected one of the predetermined positions. The specimen carrier mean is constituted by a specimen holding bar mounted on the specimen table longitudinally movably in a direction perpendicular to both of the optical axis and the lens axis, the specimen being removably mounted on the specimen holding bar. More preferably, the specimen holding bar is movably inserted through an elongated guide member which is fixedly secured to the specimen table, wherein the displacement of the specimen holding bar which corresponds to the distance between the lens axis and the optical axis is determined by stopper members mounted on the specimen holding bar in cooperation with the guide member.

The above and other objects, novel features and advantages of the invention will become more apparent from the following detailed description of exemplary embodiments of the invention. The description makes reference to the accompanying drawings.

DETAILED DESCRIPTION OF THE PREFERRED EMBODIMENTS

Now, the invention will be described by referring to the accompanying drawings which illustrate an electron microscope combined with an optical microscope according to the present invention.

Figure 1:
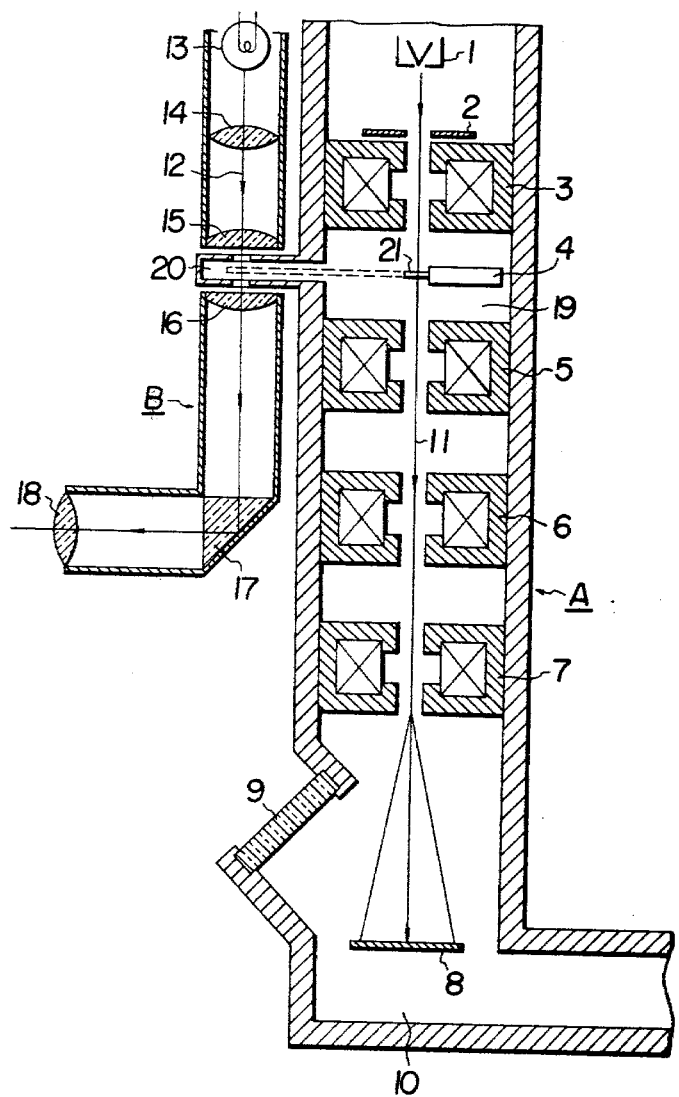
FIG. 1 shows schematically in a longitudinal sectional view an arrangement of an electron microscope incorporating an optical microscope according to an embodiment of the invention.

Referring to FIG. 1 which shows schematically in a vertical sectional view a combined assembly of an electron microscope and an optical microscope according to an embodiment of the invention, reference letter A denotes generally a general arrangement of the electron microscope which is composed of an electron gun 1, an anode plate 2, a focussing lens 3, a specimen table 4, an objective lens 5, an intermediate lens 6, a projection lens 7 and a fluorescent screen 8 arrayed in a conventional manner. An electron beam emitted from the electron gun 1 passes through a specimen supported on the specimen table 4 and subsequently undergoes magnifying actions of the lenses 5, 6 and 7, whereby a magnified image of the specimen is projected onto the fluorescent screen 8 for observation through a view window 9. Disposed below the fluorescent screen 8 is a photographing chamber 10 in which a camera mechanism (not shown) may be provided for recording the magnified specimen image produced on the fluorescent screen 8 on a dry-plate or photographic film.

An optical microscope generally denoted by reference letter B is provided in juxtaposition with the electron microscope assembly A so that the optical axis 12 of the optical microscope B extends in parallel with the lens axis 11 of the electron microscope assembly A. The optical microscope B comprises a light source 13, condenser lenses 14 and 15, an objective lens 16, a prism 17 and eyepiece 18 arrayed in a manner known per se.

As will be seen from FIG. 1, a portion of a side wall of a specimen chamber 19 in which the specimen table 4 is disposed and which is located above the objective lens 5 of the electron microscope assembly A projects laterally to form a specimen accommodating chamber 20 which lies in a plane extending perpendicularly to the optical axis 12 of the optical microscope B and is positioned between the condenser lens 15 and the objective lens 16 of the optical microscope B. The specimen accommodating chamber 20 is hermetically constructed and communicated to the specimen chamber 20 of the electron microscope A. It will be appreciated that at least those portions of the specimen accommodating chamber 20 which are located adjacent to and around the optical aixs 12 of the microscope B are formed of a light-transmissive material so that the light beam emitted from the light source 13 is allowed to pass through the specimen accommodating chamber 20 along the optical axis 12.

Provided in the specimen accommodating chamber 19 is a specimen transfer apparatus which includes the specimen table 4 and a specimen carrying bar 21. As will be seen from FIG. 1, the specimen table 4 is disposed within the specimen chamber 19 in a plane extending pertendicularly to the lens axis 11 and is adapted to be moved in that plane in two directions intersecting orthogonally to each other through convenient driving means.

The specimen carrying bar 21 which is mounted on the specimen table 4 in an appropriate manner described hereinafter and projects from the table 4 in the direction orthogonal to the lens axis 11 and the optical axis 12 is adapted to be reciprocally moved so as to be able to position alternatively the speciman at the lens axis 11 in the specimen chamber 19 of the electron microscope A and at the optical axis 12 in the specimen accommodating chamber 20, as will be described in detail hereinafter. It should be mentioned that the specimen to be observed is held by the specimen holding bar 21 at a free end portion thereof.

Figure 2:
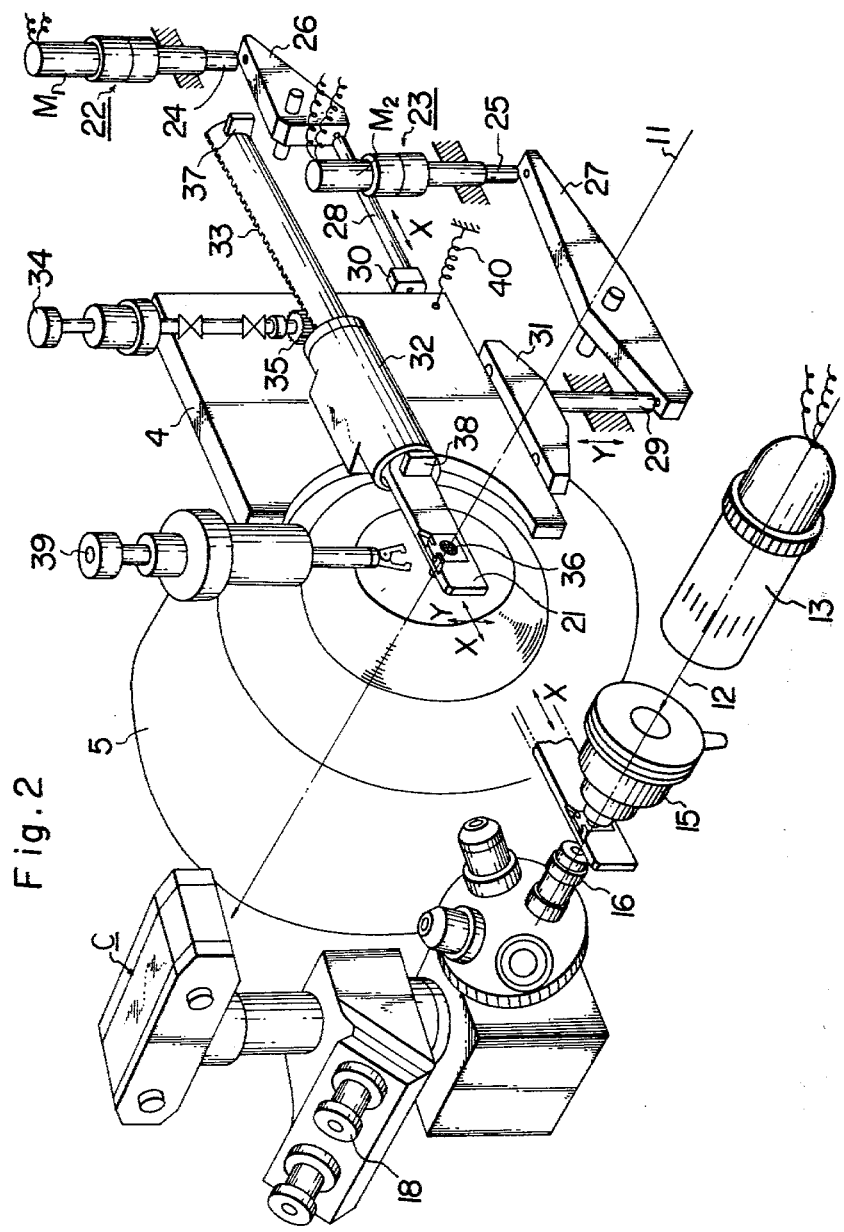
FIG. 2 is a perspective view to illustrate a structure of a specimen transfer mechanism incorporated in the microscope assembly according to the invention.

Now, referring to FIG. 2 which shows in a perspective view a specimen transfer apparatus according to an exemplary embodiment of the invention, the specimen table 4 is positioned below the objective lens 5 of the electron microscope assembly 4 in a plane extending orthogonally to the lens axis 11 and adapted to be moved in two directions X and Y orthogonally intersecting each other by means of an X-axis drive mechanism 22 and a Y-axis drive mechanism 23 which are driven by respective drive sources such as electric motors $M_1$ and $M_2$. More specifically, the X-axis drive mechanism 22 comprises a rotation-linear movement converter of a conventional structure (not shown) which serves to convert the rotation of the motor $M_1$ to reciprocatable linear movement of the output shaft 24. When the output shaft 24 is moved downwardly in the Y-axis direction as viewed in FIG. 2, a pad 30 is pressed against a lateral side of the table 4 through a swingable lever 26 and a connecting rod 28, resulting in that the table 4 is moved in the X-axis direction. On the other hand, the Y-axis drive mechanism 23 comprises a rotation-linear movement of the similar structure as that of the X-axis drive mechanism 22 which serves to convert the rotation output from the associated motor $M_2$ to a reciprocatable linear movement of an output shaft 25. When the shaft 25 is moved downwardly as viewed in FIG. 2, a pad 31 is pressed against the bottom side of the table 4 through a swingable lever 27 and a connecting rod 29, whereby the table 4 is moved upward in the Y-axis direction.

It will be self-explanatory that, upon retractions of the shafts 24 and 25, the table 4 is reset to the starting position under the influence of a return spring 40. The drive mechanisms 22 and 23 cooperates to constitute a fine adjustment mechanism for bringing a selected portion of the specimen into an exact alingment with the optical axis 11 of the optical microscope B or the lens axis 11 of the electron microscope A. In this connection, a command for actuating the motors $M_1$ and/or $M_2$ may be issued from suitable alingment means.

Fixedly secured on the specimen table 4 is a cylindrical guide sleeve 32 positioned so that the longitudinal center axis thereof extends perpendicularly to both the optical axis 12 and the lens axis 11. The specimen holding bar 21 has a cylindrical intermediate portion at which the bar 21 is slidably inserted through the guide sleeve 32. A rack 33 is formed in the specimen holding bar 21 over a substantially rear half end portion thereof. A pinion 35 mounted on an output shaft of a specimen transfer apparatus 34 is adapted to be disengageably meshed with the rack 33. The specimen 36 to be examined is held by the bar 21 at a front end portion thereof. A pair of stoppers 37 and 38 are mounted on the specimen holding bar 21 with the cylindrical guide sleeve 32 being interposed therebetween so that the stoppers 37 and 38 cooperate with opposite end faces of the guide sleeve 32 to stop the movement of the specimen holding bar 21 in either direction when a selected portion of the specimen 36 is indexed to a position aligned with the optical axis 12 of the optical microscope B or with the lens axis 11 of the electron microscope. To this end, the distance between the stoppers 37 and 38 as well as the length of this guide sleeve 32 are so selected that when the specimen 36 has been displaced from the position aligned with the lens axis 11 or the optical axis to the position aligned with the optical axis 12 or lens axis 11, the stopper 37 or 38 will bear against the one or the other end of the guide sleeve 32 thereby to inhibit a further displacement of the specimen holding bar 21. In other words, the displacement of the specimen holding bar 21 is so selected as to correspond to the distance between the lens axis 11 of the electron microscope A and the optical axis 12 of the optical microscope B. By virtue of such arrangement, it is possible to transfer the specimen 36 from the position aligned with the optical axis 12 of the optical microscope B to the position aligned with the lens axis 11 of the electron microscope or vice versa merely by correspondingly operating the transfer mechanism 34 inclusive of the rack 33 and the pinion 35 without requiring visual monitoring observation during the transfer operation. In FIG. 2, reference numeral 39 denotes a specimen exchange mechanism of an air lock type which per se is known in the art.

It should be mentioned that the plane in which the specimen holding bar 21 is displaced extends in parallel with the plane in which the specimen table 4 is moved along the X- and Y-axes as described hereinbefore. Accordingly, although the guide sleeve 32 is mounted on the front surface of the table 4 as viewed in FIG. 2, it is possible to mount the sleeve on the rear surface of the table 4. Of course, the planes of the specimen holding bar 21 and the table 4 may be coplanar with each other. Thus, the guide sleeve 32 mounted on the specimen table 4 may be omitted and replaced by a through-hole formed in the specimen table 4 itself through which the specimen holding bar 21 is slidably inserted. In this case, the table 4 must have a greater thickness.

In operation, it is assumed that observations through the optical microscope B is performed in precedence to the observation through the electron microscope A for an identical portion of the specimen 36. In the first place, the specimen 36 is positioned on the optical axis 12 of the optical microscope B by moving the specimen holding bar 21 toward the optical axis 12 until the stopper 37 bears against the associated end face of the guide sleeve 32 through operation of the specimen transfer mechanism 34 and subsequently a desired portion of the specimen 36 is indexed at the observing position exactly aligned with the optical axis 12 of the optical microscope B with the aid of the fine position aligner apparatus constituted by the X- and Y-axes drive mechanism 22 and 23. The specimen is now in the state to be observed at a desired magnification. Subsequently, the specimen holding bar 21 is moved backward in the X-direction to the position delimited by the stopper 38 bearing against the associated end face of the guide sleeve 32 through operation of the specimen transfer mechanism. At this position, the specimen 36 is located on the lens axis 11 of the electron microscope A with a high accuracy. It will be readily appreciated that the specimen will neither be upset nor inclined during the transfer operation because the specimen holding bar 31 is moved reciprocally in the plane orthogonal to both the optical axis 12 and the lens axis 11. Subsequently, the portion of the specimen which has been observed through the optical microscope B is brought into exact alignment with the lens axis 11 of the electron microscope by operating the aligning drive mechanisms 22 and 23. By virtue of the fact that the single specimen table 4 is used commonly to both the electron microscope A and the optical microscope B, the positioning of the specimen as well as the aligning adjustment thereof at the lens axis 11 and the optical axis 12 can be accomplished in the substantially same manner to facilitiate the correspondence identification of the concerned portion of specimen. Such positional alignment and correspondence identification procedure can be further simplified by employing the same magnification factor for the electron microscope as the one for the optical microscope in the positional alignment. Thereafter, the observation through the electron microscope A can be effected with an increased magnification.

From the foregoing description, it will be appreciated that, with the arrangement of the electron microscope combined with the optical microscope, the transfer of a specimen between the electron microscope and the optical microscope can be effected in a much facilitated manner without involving positional deviation of the specimen such as upsetting, vertical displacement, inclination or the like, whereby the same fragmental portion of the specimen can be easily interchangeably observed through both microscopes. Further, in view of the similar manipulation required for indexing the specimen at the observing positions in both of the microscopes, the procedure for positioning a desired portion of the specimen on the optical axis of the optical microscope may be memorized in a storage of an electronic computer, whereby the same procedure can be automatically reproduced for positioning the corresponding portion of the specimen on the lens axis of the electron microscope. In this manner, the interchangeable observation of a specimen through the optical and the electron microscope can be conducted rapidly with an improved accuracy. In FIG. 2, reference character C designates a photographic camera for taking a picture of the microscopical image of a specimen.

Although the exemplary embodiments of the invention which are believed to be preferable have been illustrated and described, it will be appreciated that many variations and modifications will readily occur to those skilled in the art without departing from the spirit and scope of the invention. For example, the condenser lens 15 and the objective lens of the optical microscope B can be disposed in a vacuum chamber communicated to the specimen chamber of the electron microscope. Further, instead of providing the specific specimen accommodating chamber 20 for the optical microscope, it is possible to form a passage in a lens drum of the electron microscope through which the specimen holding bar 21 can be reciprocally displaced, with suitable cover means being provided for the passage. Besides, the displacement of the specimen table 4 may be controlled with reference to a polar coordinate system on the basis of distance and direction instead of using the Cartesian coordinates. Accordingly, the invention is never restricted to the embodiments disclosed herein.

What is claimed is:

1. An electron microscope provided with an optical microscope, wherein said optical microscope is juxtaposed adjacent to the electron microscope assembly so that the optical axis of said optical microscope extends in parallel to the lens axis of said electron microscope assembly, comprising specimen transfer means provided in common to both of said electron microscope assembly and said optical microscope for interchangeably positioning a specimen to be observed at respective predetermined positions along said lens axis and said optical axis for observations through said electron microscope and said optical microscope, respectively, said specimen transfer means including specimen carrier means adapted to be displaced in two-dimensional direction in a plane extending orthogonally to both of said lens axis and said optical axis thereby to interchangeably position said specimen at said predetermined positions through displacement of said specimen carrier means corresponding to a distance between said lens axis and said optical axis, whereby the same specimen is allowed to be interchangeably observed through both of said electron microscope and said optical microscope by correspondingly manipulating said specimen transfer means.

2. An electron microscope provided with an optical microscope as set forth in claim 1, wherein one of said predetermined position is located in a specimen chamber of said electron microscope, while the other of said predetermined positions is located in a specimen accommodating chamber provided in said optical microscope, said specimen accommodating chamber being constituted by an extension of said specimen chamber of said electron microscope extending in a plane intersecting orthogonally said optical axis of said optical microscope and having light transmissive portions formed at least along said optical axis, whereby said specimen is interchangeably transferred between said specimen chamber and said specimen accommodating chamber through corresponding displacement of said specimen carrier means in the plane extending orthogonally to said lens axis and said optical axis.

3. An electron microscope provided with an optical microscope as set forth in claim 1, wherein said specimen transfer means includes a specimen table which is adapted to be movable in said plane in two orthogonal directions and means for moving said specimen table for positioning said specimen accurately at a selected one of said predetermined positions.

4. An electron microscope provided with an optical microscope as set forth in claim 3, wherein said specimen carrier mean is constituted by a specimen holding bar mounted on said specimen table longitudinally movably in a direction perpendicular to both of said optical axis and said lens axis, said specimen being removably mounted on said specimen holding bar.

5. An electron microscope provided with an optical microscope as set forth in claim 4, wherein said specimen holding bar is movably inserted through an elongated guide member which is fixedly secured to said specimen table, the displacement of said specimen holding bar which corresponds to the distance between said lens axis and said optical axis being determined by stopper means mounted on said specimen holding bar.

6. An electron microscope provided with an optical microscope as set forth in claim 5, wherein said specimen is mounted at one end portion of said specimen holding bar located near to said optical axis of said optical microscope, while the other end portion of said specimen holding bar is formed with a rack which is disengageably meshed with a pinion gear of a specimen transfer drive unit.

* * * * *